(12) United States Patent
Sundström et al.

(10) Patent No.: US 9,929,737 B2
(45) Date of Patent: Mar. 27, 2018

(54) OSCILLATOR ARRANGEMENT, METHOD, COMPUTER PROGRAM AND COMMUNICATION DEVICE

(71) Applicant: Telefonaktiebolaget LM Ericsson (publ), Stockholm (SE)

(72) Inventors: Lars Sundström, Södra Sandby (SE); Robert Baldemair, Solna (SE); Ning He, Sollentuna (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 15/039,105

(22) PCT Filed: Dec. 5, 2013

(86) PCT No.: PCT/EP2013/075705
§ 371 (c)(1),
(2) Date: May 25, 2016

(87) PCT Pub. No.: WO2015/082009
PCT Pub. Date: Jun. 11, 2015

(65) Prior Publication Data
US 2017/0026049 A1    Jan. 26, 2017

(51) Int. Cl.
*H03B 5/32* (2006.01)
*H03L 7/107* (2006.01)
(Continued)

(52) U.S. Cl.
CPC .............. *H03L 7/1075* (2013.01); *H03B 5/32* (2013.01); *H03L 7/099* (2013.01); *H04W 28/14* (2013.01);
(Continued)

(58) Field of Classification Search
CPC ....... H04L 7/005; H04L 7/033; H04L 7/0331; H04L 7/00; H04B 1/44; H03L 7/099; H03L 1/025; H03L 7/104; H04W 28/14
(Continued)

(56) References Cited

U.S. PATENT DOCUMENTS 5,828,266 A * 10/1998 Couet ................. H03D 3/244
329/325
5,930,696 A * 7/1999 Tzuang ............... H03D 7/1441
348/725

(Continued)

*Primary Examiner* — Emmanuel Bayard
(74) *Attorney, Agent, or Firm* — Coats & Bennett, PLLC

(57) ABSTRACT

A reference oscillator arrangement is provided for a communication apparatus capable of communicating according to a plurality of transport formats. The reference oscillator arrangement comprises a reference oscillator controller; a resonator core comprising a reference resonator and a driving circuit for the reference resonator, wherein the resonator core is arranged to provide an oscillating signal at a frequency of the reference resonator; and a reference oscillator buffer arrangement, connected to the resonator core, comprising an active circuit arranged to provide a reference oscillator output based on the oscillating signal. The reference oscillator controller is arranged to receive information about an applied transport format and control the driving circuit and/or the active circuit based on the information about the applied transport format. An oscillator arrangement, a communication device, methods therefor and a computer program are also disclosed.

22 Claims, 6 Drawing Sheets

(51) Int. Cl.
  *H03L 7/099* (2006.01)
  *H04W 28/14* (2009.01)
(52) U.S. Cl.
  CPC ............. *H03B 2200/009* (2013.01); *H03B 2200/0062* (2013.01); *H03B 2201/038* (2013.01)
(58) Field of Classification Search
  USPC ........... 375/219–222, 354–358, 371–376
  See application file for complete search history.

(56) References Cited

U.S. PATENT DOCUMENTS

| | | | | |
|---|---|---|---|---|
| 5,950,115 A * | 9/1999 | Momtaz | ............... | H03L 7/07 327/147 |
| 6,081,164 A * | 6/2000 | Shigemori | ............... | G06F 1/08 257/E23.059 |
| 6,272,190 B1 * | 8/2001 | Campana, Jr. | ............... | H04B 7/10 375/347 |
| 6,452,948 B1 * | 9/2002 | McCallister | ............... | H04B 7/2681 370/324 |
| 6,463,049 B1 * | 10/2002 | Abe | ............... | H04B 7/2681 370/347 |
| 6,995,622 B2 * | 2/2006 | Partridge | ............... | H03B 5/04 331/154 |
| 7,181,639 B2 * | 2/2007 | Chua-Eoan | ............... | G06F 5/06 365/233.12 |
| 7,449,968 B1 * | 11/2008 | Cioffi | ............... | H03B 5/04 331/154 |
| 7,656,245 B2 * | 2/2010 | McCorquodale | ............... | G06F 1/04 331/117 FE |
| 7,863,941 B1 * | 1/2011 | Nguyen | ............... | G11C 7/065 327/55 |
| 7,907,027 B2 * | 3/2011 | Partridge | ............... | H03B 5/04 331/154 |
| 8,063,711 B2 * | 11/2011 | Sutardja | ............... | H01L 23/34 331/108 C |
| 8,089,324 B2 * | 1/2012 | Tarng | ............... | H03B 5/04 331/109 |
| 8,446,222 B2 * | 5/2013 | Brenndorfer | ............... | H03J 3/00 331/16 |
| 8,635,474 B2 * | 1/2014 | Hayakawa | ............... | G03G 15/5004 713/320 |
| 8,643,444 B2 * | 2/2014 | He | ............... | G01S 19/235 331/158 |
| 8,686,802 B1 * | 4/2014 | Brown | ............... | H03B 5/30 324/71.1 |
| 8,704,603 B2 * | 4/2014 | Taghivand | ............... | H03L 7/18 331/14 |
| 8,704,604 B2 * | 4/2014 | Schoepf | ............... | H03B 5/32 331/158 |
| 8,766,736 B2 * | 7/2014 | Isik | ............... | H03L 1/026 331/1 R |
| 8,817,358 B2 * | 8/2014 | Hong | ............... | G02B 26/001 359/260 |
| 8,981,862 B2 * | 3/2015 | Liu | ............... | H03B 5/1228 331/117 FE |
| 9,000,833 B2 * | 4/2015 | Caffee | ............... | H02N 1/006 327/516 |
| 9,007,119 B2 * | 4/2015 | Caffee | ............... | H02N 1/006 327/50 |
| 9,130,576 B2 * | 9/2015 | He | ............... | G01S 19/235 |
| 9,148,277 B2 * | 9/2015 | Pyeon | ............... | G06F 13/1689 |
| 9,165,170 B1 * | 10/2015 | Gutnik | ............... | G06K 19/0723 |
| 9,379,555 B2 * | 6/2016 | Huynh | ............... | H02J 50/12 |
| 9,384,152 B2 * | 7/2016 | Best | ............... | G06F 13/1689 |
| 2004/0085145 A1 * | 5/2004 | Dinn | ............... | H03F 3/2171 331/117 R |
| 2005/0068115 A1 * | 3/2005 | Atsumi | ............... | H03L 7/26 331/94.1 |
| 2005/0231581 A1 * | 10/2005 | Nomura | ............... | G02B 26/105 347/132 |
| 2006/0152293 A1 * | 7/2006 | McCorquodale | ............... | G06F 1/04 331/74 |
| 2006/0158267 A1 * | 7/2006 | McCorquodale | ............... | G06F 1/04 331/34 |
| 2006/0158268 A1 * | 7/2006 | McCorquodale | ............... | G06F 1/04 331/34 |
| 2007/0222528 A1 * | 9/2007 | Pernia | ............... | H03L 1/022 331/44 |
| 2007/0222529 A1 * | 9/2007 | Carichner | ............... | H03L 7/099 331/44 |
| 2007/0297553 A1 * | 12/2007 | Sutioso | ............... | H03L 7/081 375/373 |
| 2008/0104435 A1 * | 5/2008 | Pernia | ............... | G06F 1/3203 713/322 |
| 2008/0195901 A1 * | 8/2008 | Solt | ............... | G11C 29/16 714/718 |
| 2009/0146752 A1 | 6/2009 | O'Day et al. | | |
| 2009/0154629 A1 * | 6/2009 | Pyeon | ............... | G06F 13/1689 375/376 |
| 2009/0243747 A1 | 10/2009 | Gaidarzhy et al. | | |
| 2009/0261416 A1 * | 10/2009 | Raberg | ............... | B81C 1/00246 257/351 |
| 2010/0263445 A1 * | 10/2010 | Hayner | ............... | G01C 19/56 73/504.12 |
| 2012/0081822 A1 * | 4/2012 | Woo | ............... | H01L 27/0251 361/56 |
| 2012/0115534 A1 * | 5/2012 | Luo | ............... | H04W 52/286 455/522 |
| 2012/0124432 A1 * | 5/2012 | Pesetski | ............... | B82Y 10/00 714/709 |
| 2013/0142223 A1 * | 6/2013 | Kuo | ............... | H04W 36/18 375/219 |
| 2014/0019833 A1 * | 1/2014 | Bae | ............... | G06F 11/1004 714/807 |
| 2014/0097842 A1 * | 4/2014 | Yang | ............... | G01R 33/60 324/316 |
| 2014/0233138 A1 * | 8/2014 | Gliebe | ............... | H02H 1/06 361/45 |
| 2015/0061610 A1 * | 3/2015 | Hu | ............... | H02M 1/00 323/234 |
| 2015/0215793 A1 * | 7/2015 | Siomina | ............... | G01S 5/0205 455/456.1 |
| 2015/0281841 A1 * | 10/2015 | Koike | ............... | H03C 3/0916 381/3 |

* cited by examiner

OSCILLATOR ARRANGEMENT, METHOD, COMPUTER PROGRAM AND COMMUNICATION DEVICE

TECHNICAL FIELD

The present invention generally relates to a reference oscillator arrangement, an oscillator arrangement, methods of controlling such arrangements, a computer program for implementing the methods, and a communication device including such arrangements.

BACKGROUND

Radio frequency (RF) transmitters (TX) and receivers (RX) use RF local oscillators (LO) driving mixers that in turn are used to up-convert and down-convert signals. The LO signals, generated by frequency synthesizers such as phase-locked-loops (PLLs), exhibit phase noise and that ultimately limits the attainable performance of a radio link. The problem with phase noise is two-fold. Firstly, the phase noise at smaller frequency offsets from the LO frequency generally leads to a limit on error-vector magnitude (EVM) and in the case of orthogonal-frequency division multiplexing, OFDM, transmission it is readily understood that subcarriers will interfere with one another. Secondly, phase noise at higher offsets is generally a problem in radio communication systems, like cellular radio, with very crowded spectrum and where a strong signal, adjacent in frequency to a desired signal, will mix with the phase noise and generate co-channel interference, which is commonly referred to as reciprocal mixing. Thus, the issue of phase noise needs to be considered.

Designing hardware for radio communication using mm wavelength frequencies (e.g. 60 GHz), especially battery operated user equipment or low power access nodes, is challenging for many reasons. LO phase noise is one such aspect that when compared with cellular radio standards or WiFi, e.g. 802.11n,ac, etc., operating in the 0.5-5 GHz regime it will be much worse in the mm wavelength regime. For a given power consumption budget for a controlled oscillator the phase noise in dBc/Hz at a given offset roughly scales with $20*\log(f_{LO})$. To obtain decent phase noise performance from an LO synthesizer, incorporating a controlled oscillator, CO, providing an oscillating signal at a frequency based on a control signal, without increasing CO power consumption excessively compared with the low-GHz regime, one can increase the loop bandwidth of the LO synthesizer. Increasing the LO synthesizer loop bandwidth will also lead to faster frequency lock and tracking behaviour. On the other hand, this will increase the requirements on the frequency reference generator, typically a crystal oscillator accordingly such that its associated power consumption may reach that of the LO synthesizer or even become larger, on the order of 100's of mW instead of a few mW as is common for the low-GHz range user equipment. Such high reference oscillator power consumption is not desired in battery operated equipment or in other equipment on a low power budget.

Circuits designed for very low phase noise may have relatively high power consumption compared with circuits where more phase noise is accepted. It is therefore a desire to provide an approach providing both acceptable phase noise and relatively low power consumption.

SUMMARY

The invention is based on the understanding by having a reconfigurable reference oscillator, it is feasible to save power when possible based how much the reference oscillator phase noise is allowed to deteriorate the desired signal in transmission and/or reception. This may depend on for example at least one of error-vector magnitude, signal-to-noise ratio, modulation format, or any other parameter that indicate quality of the desired signal. These are normally known for a given transport format, i.e. a format for transmission of information which both the transmitter at a transmitting side and a receiver at a receiving side use. The reference oscillator performance may thus be adjusted as these parameters in turn depend on transmission and reception conditions.

According to a first aspect, there is provided a reference oscillator arrangement for a communication apparatus capable of communicating according to a plurality of transport formats. The reference oscillator arrangement comprises a reference oscillator controller; a resonator core comprising a reference resonator and a driving circuit for the reference resonator, wherein the resonator core is arranged to provide an oscillating signal at a frequency of the reference resonator; and a reference oscillator buffer arrangement, connected to the resonator core, comprising an active circuit arranged to provide a reference oscillator output based on the oscillating signal. The reference oscillator controller is arranged to receive information about an applied transport format and control the driving circuit and/or the active circuit based on the information about the applied transport format.

The reference resonator may be a crystal resonator or a microelectromechanical system, MEMS, resonator.

The reference oscillator controller may be arranged to perform the control by controlling bias of the driving circuit and/or the active circuit.

The reference oscillator buffer arrangement may comprise a plurality of buffers for providing output signals to different circuits of the communication apparatus, each buffer comprising an active circuit, wherein the active circuits of at least a set of the buffers may be individually controllable.

The controller may comprise a look-up table arranged to map transport formats to control settings of the driving circuit and/or the active circuit.

The controller may be arranged to control to adjust the driving circuit once for a transmission burst of the communication apparatus.

The controller may be arranged to control to adjust the active circuit at a plurality of instances during a transmission burst of the communication apparatus.

According to a second aspect, there is provided an oscillator arrangement for a communication apparatus capable of communicating according to a plurality of transport formats. The oscillator arrangement comprises a reference oscillator arrangement according to the first aspect capable of adjusting phase noise of the generated reference oscillator output; and a phase-locked loop circuit comprising a phase detector arranged to receive an output signal from the reference oscillator arrangement.

The phase-locked loop circuit may be arranged to adjust a loop bandwidth of a phase-locked loop thereof such that an increase in phase noise of the generated reference oscillator output implies a decrease in loop bandwidth, and a decrease in phase noise of the generated reference oscillator output implies an increase in loop bandwidth.

The phase-locked loop circuit may comprise a controlled oscillator which is arranged to provide an oscillator signal based on a filtered output from the phase detector. The controlled oscillator may be arranged to receive different settings from the reference oscillator controller for providing different levels of phase noise such that an increase in phase noise of the generated reference oscillator output implies an increase in phase noise of the controlled oscillator, and a decrease in phase noise of the generated reference oscillator output causes a decrease in phase noise of the controlled oscillator.

The reference oscillator arrangement may be arranged to be controlled such that a decrease in a loop bandwidth of a phase-locked loop of the phase-locked loop circuit implies an increase in phase noise of the generated reference oscillator output, an increase in the loop bandwidth implies and a decrease in phase noise of the generated reference oscillator output.

According to a third aspect, there is provided a method of controlling a oscillator arrangement for a communication apparatus capable of communicating according to a plurality of transport formats. The method comprises providing an oscillating signal at a frequency of a reference resonator of a resonator core comprising the reference resonator and a driving circuit for the reference resonator; providing a reference oscillator output based on the oscillating signal by a reference oscillator buffer arrangement connected to the resonator core; receiving information about an applied transport format; and controlling the driving circuit and/or the active circuit based on the information about the applied transport format.

The controlling may comprise controlling bias of the driving circuit and/or the active circuit.

The reference oscillator buffer arrangement may comprise a plurality of buffers for providing output signals to different circuits of the communication apparatus, each buffer comprising an active circuit, wherein the method may comprise controlling active circuits of at least a set of the buffers individually.

The method may comprise controlling settings of the driving circuit and/or the active circuit by mapping transport formats to control settings from a look-up table.

The method may comprise controlling the driving circuit to adjust once for a transmission burst of the communication apparatus.

The method may comprise controlling the active circuit to adjust at a plurality of instances during a transmission burst of the communication apparatus.

The oscillator arrangement may comprise a phase-locked loop circuit comprising a phase detector arranged to receive an output signal from a reference oscillator arrangement. The method may comprise adjusting a loop bandwidth of a phase-locked loop of the phase-locked loop circuit such that an increase in phase noise of the generated reference oscillator output implies a decrease in loop bandwidth, and that a decrease in phase noise of the generated reference oscillator output implies an increase in loop bandwidth.

The oscillator arrangement may comprise a phase-locked loop circuit comprising a phase detector arranged to receive an output signal from a reference oscillator arrangement, and the phase-locked loop circuit may comprise a controlled oscillator which is arranged to provide an oscillator signal based on a filtered output from the phase detector, and wherein the controlled oscillator may be arranged to receive different settings from the reference oscillator controller for providing different levels of phase noise. The method may comprise controlling the controlled oscillator such that an increase in phase noise of the generated reference oscillator output implies an increase in phase noise of the controlled oscillator, a decrease in phase noise of the generated reference oscillator output implies a decrease in phase noise of the controlled oscillator.

The oscillator arrangement may comprise a phase-locked loop circuit and a reference oscillator arrangement, wherein the reference oscillator arrangement comprises the reference resonator core and the reference buffer arrangement. The method may comprise controlling the reference oscillator arrangement such that an increase in a loop bandwidth of the phase-locked loop circuit implies a decrease in phase noise of the generated reference oscillator output, and a decrease in the loop bandwidth implies an increase in phase noise of the generated reference oscillator output.

According to a fourth aspect, there is provided a computer program comprising instructions which, when executed on a processor of a controller for an oscillator arrangement, causes the oscillator arrangement to perform the method according to the third aspect.

According to a fifth aspect, there is provided a communication device for operating with a radio access network and capable of communicating according to a plurality of transport formats. The communication device comprises a transceiver arranged to transmit or receive one or more data messages over a wireless channel; and an oscillator arrangement according to the first or second aspects.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

PLLs include a loop filter that limits the bandwidth of the loop, carefully designed to shape the overall phase noise according to given specifications and that overall phase noise in turn is composed of contributions from controlled oscillator (CO), other building blocks within the PLL, as well as the reference oscillator (RO), which here is not considered as a part of the PLL. Lowering the bandwidth will lead to that the CO's contribution to integrated phase noise will increase and increasing the bandwidth will conversely lead to a decreased contribution from the CO. The opposite applies to the RO serving as a reference within the loop bandwidth. The larger the loop bandwidth the larger the frequency range over which the PLL will track the behaviour of the RO. Increasing the loop bandwidth at least has one advantage, the PLL will lock faster. In case of schemes where reception and/or transmission is not continuous, commonly referred to as discontinuous reception (DRX) and transmission (DTX), there is an opportunity to save power by turning of transceiver blocks when not in use. As the PLL will take some time to lock it must be turned on a certain time ahead of its anticipated use. For today's cellular equipment in the low-GHz regime the PLL bandwidth is typically a few hundred kHz and cold start, i.e. being powered on, to lock may take 100-200 us. If the power consumption of the PLL is high the ability to lock PLL fast may lead to significant savings in power when using DRX and/or DTX schemes. In other words, having a large PLL bandwidth is beneficial in this respect.

A large PLL bandwidth inevitably increases the phase noise contribution from the RO and in case of mm wavelength (mmW) LO frequencies this becomes even worse due to the multiplication factor of the phase noise when transformed from the reference oscillator frequency to the LO frequency, i.e. phase noise increase as 20×log 10(N) with $N=f_{LO}/f_{RO}$.

Figure 10:
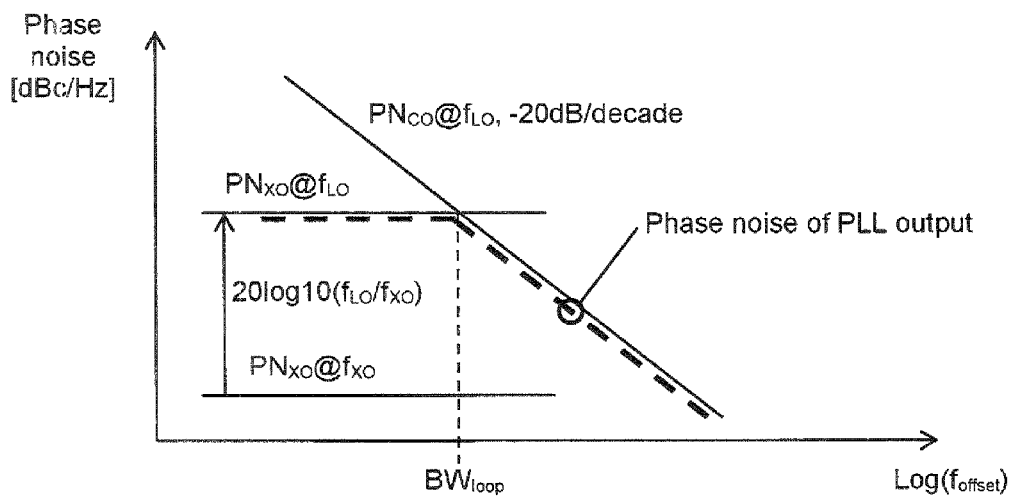
FIG. 10 is an illustrative view of phase noise contributions from reference oscillator and controlled oscillator with balanced choice of loop bandwidth.

FIG. 10 is an illustrative view of phase noise contributions from reference oscillator and controlled oscillator with balanced choice of loop bandwidth. The CO noise is assumed to drop by 20 dB/decade over the frequency of interest while the RO phase noise is rather constant. The loop bandwidth is defined here as the bandwidth over which the PLL tracks the RO behaviour. From FIG. 10 it is readily understood that it may be selected roughly around the crossing of the multiplied RO phase noise and the CO phase noise (as illustrated) to minimize the overall phase noise.

Figure 11:
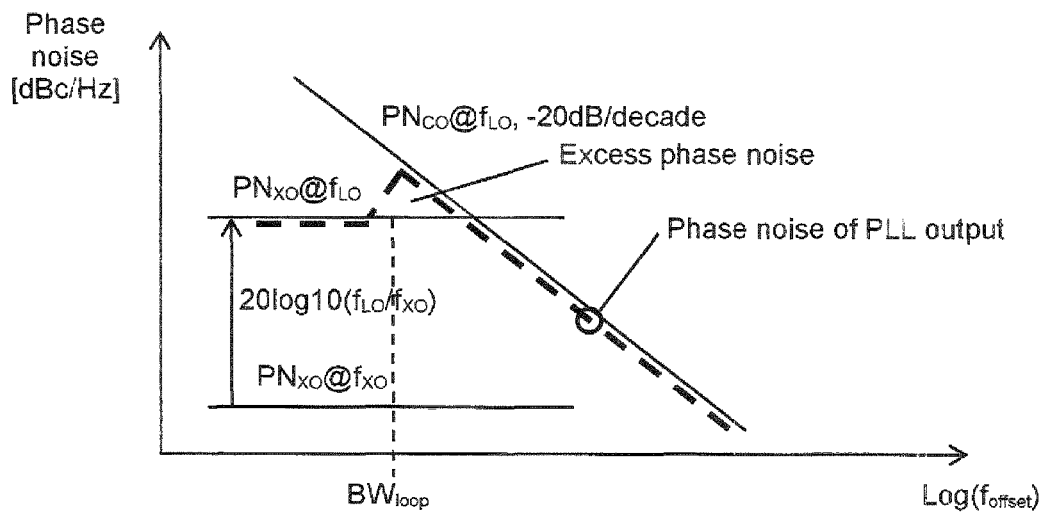
FIG. 11 is an illustrative view of phase noise contributions from reference oscillator and controlled oscillator with low loop bandwidth.
Figure 12:
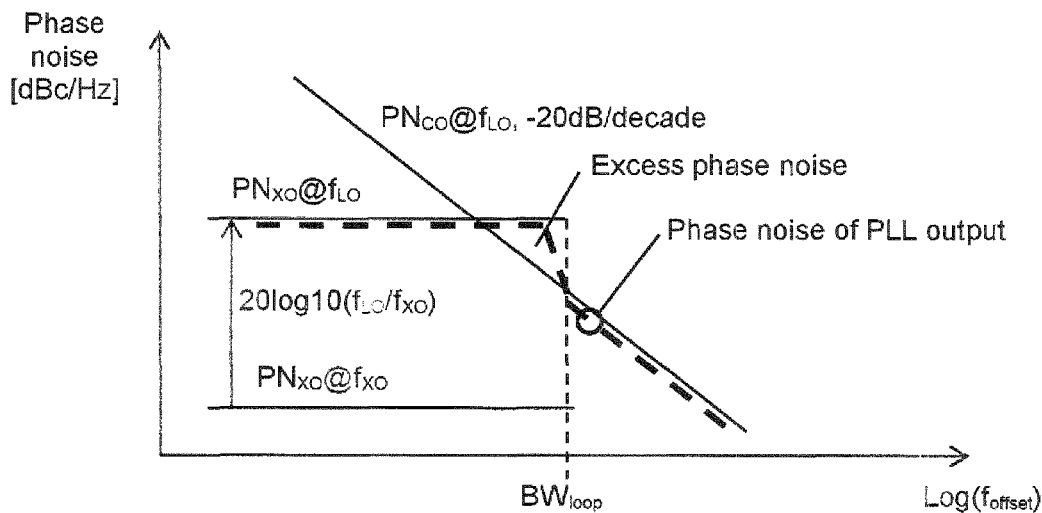
FIG. 12 is an illustrative view of phase noise contribution from reference oscillator and controlled oscillator with high bandwidth.

FIG. 11 is an illustrative view of phase noise contributions from reference oscillator and controlled oscillator with low loop bandwidth. FIG. 12 is an illustrative view of phase noise contribution from reference oscillator and controlled oscillator with high bandwidth. If the loop bandwidth is chosen to be smaller or larger it leads to the principle phase noise shapes as illustrate in FIGS. 11 and 12, respectively.

The following examples aim to further illustrate the relation between RO and CO phase noise when used in a PLL and it should be understood that these examples are highly simplified; with simple phase noise models for RO and CO and that omit other significant phase noise contributors within a PLL like the divider and the phase detector. The loop bandwidth is primarily determined by the loop filter (FIG. 4) of the PLL and the integrating property of the CO.

Below, f denotes a frequency, N denotes transform factor given by the PLL, PN denotes phase noise and IPN denotes integrated phase noise. Index 1 denotes that the value is related to Example 1, i.e. to distinguish from Example 2 which consequently has index 2.

Cellular UE radio: $f_{RO1}$=26 MHz, $f_{LO1}$=2.6 GHz. Example 1:
$N_1=f_{LO1}/f_{RO1}=100 \rightarrow N_{dB,1}=40$ dB $PN_{RO1@fRO1}$=−140 dBc/Hz$\rightarrow PN_{RO1@fLO1}=PN_{RO1@fRO1}+N_{dB,1}$=−100 dBc/Hz $PN_{CO1@fLO1}$=−120 dBc/Hz @$f_{offset,1}$=1 MHz$\rightarrow$ $PN_{RO1@fLO1}=PN_{CO1@fLO1}$=−100 dBc/Hz @$f_{offset,1}=BW_{loop,1}$=100 kHz Integrated Phase Noise:

$IPN_1$=−100 dBc/Hz+10 log 10($BW_{loop,1}$)+10 log 10($\pi/2$)=−48 dBc

The $\pi/2$ factor is the equivalent noise bandwidth for a first order system.

When most of the phase noise power resides within the bandwidth of the signal the integrated phase noise power roughly defines the minimum attainable EVM or the reciprocal of the maximum attainable SNR. Thus, in the example above the SNR can never be better than 48 dB (assumes no correction/tracking of the phase noise frequency range considered).

mmW radio: $f_{RO2}$=60 MHz, $f_{LO2}$=60 GHz. $N_2=f_{LO2}/f_{RO2}$=1000$\rightarrow N_{dB,2}$=60 dB Example 2:

$PN_{RO2@fRO2}$=−160 dBc/Hz$\rightarrow PN_{RO2@fLO2}=PN_{RO2@fRO2}+N_{dB,2}$=−100 dBc/Hz $PN_{CO2@fLO2}$=−130 dBc/Hz @$f_{offset,2}$=10 MHz$\rightarrow$ $PN_{RO2@fLO2}=PN_{CO2@fLO2}$=−100 dBc/Hz @$f_{offset,2}=BW_{loop,2}$=316 kHz Integrated Phase Noise:

$IPN_2$=−100 dBc/Hz+10 log 10($BW_{loop,2}$)+10 log 10($\pi/2$)=−43 dBc

In this example the IPN is 5 dB worse than in Example 1, yet the RO phase noise specification is very much tougher, 20 dB lower phase noise with an operating frequency that is more than twice as high. Also, the CO figure of merit, defined as $FoM_{CO}=PN@f_{offset}+20 \cdot \log 10(f_{offset}/f_{CO})+10 \cdot \log 10(P_{dc,mW}/1 \text{ mW})$, (the lower, the higher performance) is somewhat different in the two cases (assuming same $P_{dc,mW}$):

$FoM_{CO2}-FoM_{CO1}$=−130+(−68.3)−(−120+(−75.6))−2.7 dB

Thus $CO_2$ would need a FoM some 3 dB better than $CO_1$. Since the FoM for a mmW CO reasonably cannot be expected to be any higher than a state-of-the-art CO operating at low-GHz frequencies it is concluded that the power consumption will need to be higher in the mmW CO too.

All in all, achieving the same integrated phase noise at mmW as in low-GHz range leads to substantially higher requirements and foremost this comes at the cost of increased power consumption in the RO. In the above two cases the RO would typically consume a few mW in Example 1 whereas in Example 2 that would jump to 100's of mW. The impact of the RO can be reduced by lowering the loop bandwidth but then comes at the expense of higher requirements on the CO and consequently higher power consumption in the CO. Furthermore, a small loop bandwidth will result in longer time to lock for the PLL. In battery operated transceivers, power is saved by turning off blocks that are not used. This can be done on a very small time scale, say between receptions of data bursts, say with a cycle of 10's of ms to 10's of μs. This means that a slow PLL, i.e. with small loop bandwidth, needs to be powered on a long time relative to the time it is actually being used, i.e. during reception/transmission, to reach lock before use. This will negatively affect the power saved by switching off the PLL between uses.

Figure 1:
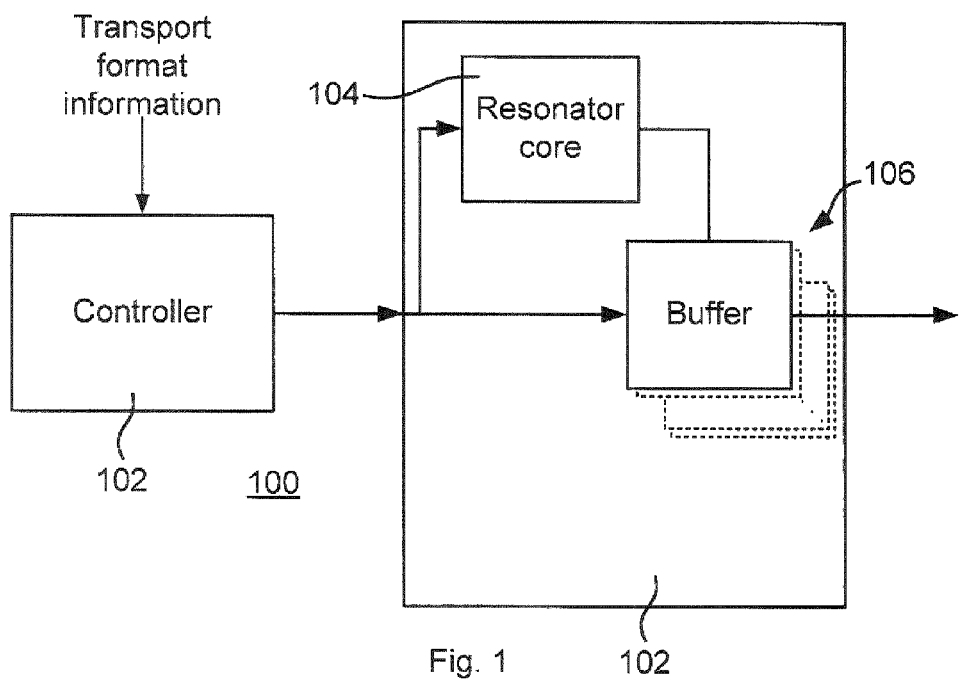
FIG. 1 schematically illustrates a reference oscillator arrangement according to an embodiment.

FIG. 1 schematically illustrates a reference oscillator arrangement 100 according to an embodiment. The reference oscillator arrangement 100 comprises a controller 102 and a reference oscillator 105 comprising a resonator core 104 and a buffer arrangement 106.

The resonator core 104 comprises a reference resonator, e.g. a crystal or MEMS resonator. The resonator core further comprises a driving circuit for the reference resonator. An example of a resonator core will be demonstrated with reference to FIG. 2.

The buffer arrangement 106 is connected to the resonator core 104 to receive an oscillating signal provided by the resonator core 104, and comprises an active circuit for providing an output of the reference oscillator arrangement 100.

The reference oscillator arrangement 100 is arranged to provide a reference signal for a communication apparatus capable of communicating according to a plurality of transport formats, and may then be adapted to provide suitable properties of the reference signal, and then particularly in sense of sufficiently low phase noise for the different transport formats while keeping power consumption reasonable. The controller 102 is arranged to receive information about an applied transport format and control the driving circuit of the resonator core 104 and/or the active circuit of the reference oscillator buffer arrangement 106.

The resonator core 104 may be controlled by providing suitable biasing, wherein flicker noise is controlled, and thereby phase noise.

The reference oscillator buffer arrangement 106 is arranged to provide a reference oscillator output with adapted properties of the oscillating signal. The one or more buffers of the reference buffer arrangement comprises an active circuit which may include an inverter. The properties of the oscillating signal may be slope, amplitude, flicker noise, thermal noise, shot noise, slew rate, etc. For example, by adjusting driving capability, e.g. by selecting size of the inverter of the used buffer, slope and/or amplitude may be adjusted. By selecting size of an active circuit, e.g. amplifier, flicker noise may be adjusted. By selecting DC current in the active circuit, slew rate, amplitude, flicker noise, thermal noise and shot noise may be controlled. Other adjustments that may be made are supply voltage, operating point, sizes of selected devices (e.g. transistors), etc.

The reference oscillator buffer arrangement 106 may comprise a plurality of buffers for providing a corresponding plurality of output signals to different circuits of the communication apparatus, e.g. to a receiver and to a transmitter. Thus, in embodiments, each buffer comprises its own active circuit, wherein they may be individually controllable, e.g. based on different demands from the respective circuits.

The controlling of the resonator core 104 may be sensitive to changes during operation, i.e. transmission and/or reception of a communication burst, and the adaption of control settings for the resonator core 104 may therefore be set for the burst and then not changed until next burst. The controlling of the buffer arrangement on the other hand may be changed essentially instantaneously, wherein adaptions may be made during a burst. An approach for the control in light of this is further elucidated with reference to FIG. 7. The controlling may be made based on different models of requirements from the circuit or circuits provided with reference signal(s). An approach is to provide control to the resonator core 104 in line with the demands of the circuit and/or transport format putting the most critical requirements, and then provide control to the buffer(s) based on respective actual demands. According to an embodiment, the controller 102 comprises a look-up table comprising a mapping between transport formats and control setting suitable for the respective transport formats.

Figure 2:
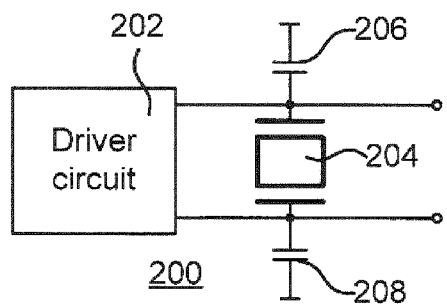
FIG. 2 schematically illustrates an example of a resonator core.

FIG. 2 schematically illustrates an example of a resonator core 200 The resonator core 200 comprises a driver circuit 202, a reference resonator 204, and circuitry 206, 208 for shunting output terminals. The driver circuit 102 drives the reference resonator 104 to oscillate at a particular frequency to define a differential output signal across the output terminals.

Figure 3:
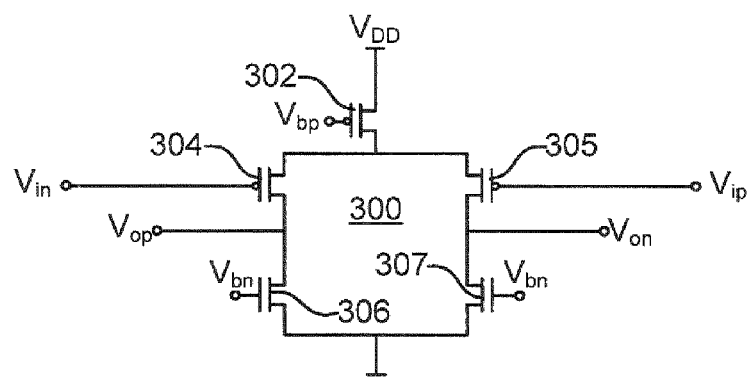
FIG. 3 schematically illustrates an example of a reference oscillator buffer.

FIG. 3 schematically illustrates an example of a reference oscillator buffer 300. The example illustrates a differential amplifier, where the oscillating signal from the resonator core is provided to inputs $V_{ip}$, $V_{in}$ and the oscillator output is provided at outputs $V_{op}$, $V_{on}$. The differential amplifier comprises a current generator transistor 302, a pair of serially connected transistors, where each pair includes an inverting transistor 304, 305 and a load transistor 306, 307.

Other examples of resonator core and/or buffer may be feasible.

Figure 4:
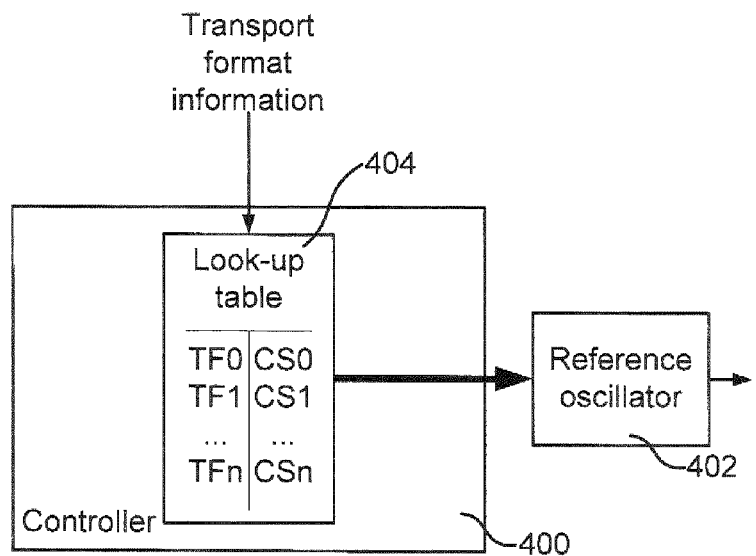
FIG. 4 schematically illustrates a controller according to an embodiment.

FIG. 4. schematically illustrates a controller 400 according to an embodiment. The controller 400 is controlling a reference oscillator 402 as demonstrated above. The controller 400 is arranged to receive information about transport formats applied by a communication device in which the reference oscillator arrangement operates, and comprises a look-up table 404 where transport formats TF0, TF1, . . . , TFn are mapped to control settings CS0, CS1, . . . , CSn, wherein the control setting corresponding to the received transport format information is provided to the oscillator 402. For cases where e.g. multiple circuits, multiple transport formats, etc. are actual at the same time, the look-up table may be a more complex structure, e.g. an n-dimensional matrix.

Figure 5:
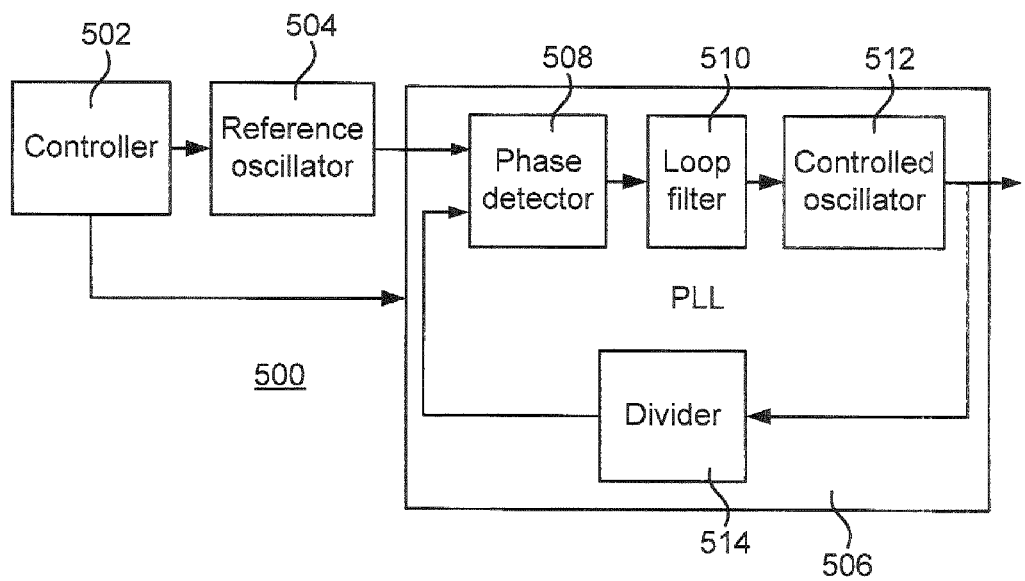
FIG. 5 schematically illustrates an oscillator arrangement according to an embodiment.

FIG. 5 schematically illustrates an oscillator arrangement 500 according to an embodiment. The oscillator arrangement 500 comprises a controller 502, a reference oscillator 504, and a phase-locked loop, PLL, circuit 506. The controller 502 controls the reference oscillator 504 according to any of the approaches demonstrated above. The PLL circuit 506 comprises a phase detector 508, a loop filter 510, a controlled oscillator 512 and a divider circuit 514. The phase detector 508 is arranged to detect a phase difference between a signal provided from the reference oscillator 504 and a signal provided from the divider circuit 514. The output may be a charge based on the detected phase difference which is provided to the loop filter 510 which may low-pass filter the signal and provide a control signal to the controlled oscillator 512, e.g. a control voltage to a voltage controlled oscillator. The controlled oscillator 512 generates a frequency based on the control signal which is provided as output of the oscillator arrangement 500, but is also fed back via the divider circuit 514 to the phase detector 508. The PLL circuit 506 will lock to a frequency that is determined by the reference oscillator frequency and the division factor of the divider circuit 514. The time to lock to this frequency is very much depending on loop bandwidth as defined by the loop filter 510, but also on controllability of the controlled oscillator 512 and the ability to detect large phase errors by the phase detector 508. The loop bandwidth also has an impact on phase noise, where large loop bandwidth may provide large phase noise, and vice versa. In line with the discussion above about how to adapt settings of the reference oscillator to phase noise demands, this may also be applied to the PLL circuit 506, wherein the oscillator arrangement 500. Thus, the controller 502 is arranged to control the PLL circuit 506 to achieve desired phase noise output by the oscillator arrangement 500. This is performed by providing a control set to the PLL circuit 506, which may comprise settings for the loop filter 510 and/or the controlled oscillator 512. Similar as demonstrated above, the control settings may be based on different control models, and may also utilize a look-up table with suitable control settings for different transport formats. The look-up table may be formed by pre-calculated and/or simulated values for the different transport formats, and also other more complex configurations, as has been discussed above with reference to provision of signals to different circuits and for different demands simultaneously.

Figure 6:
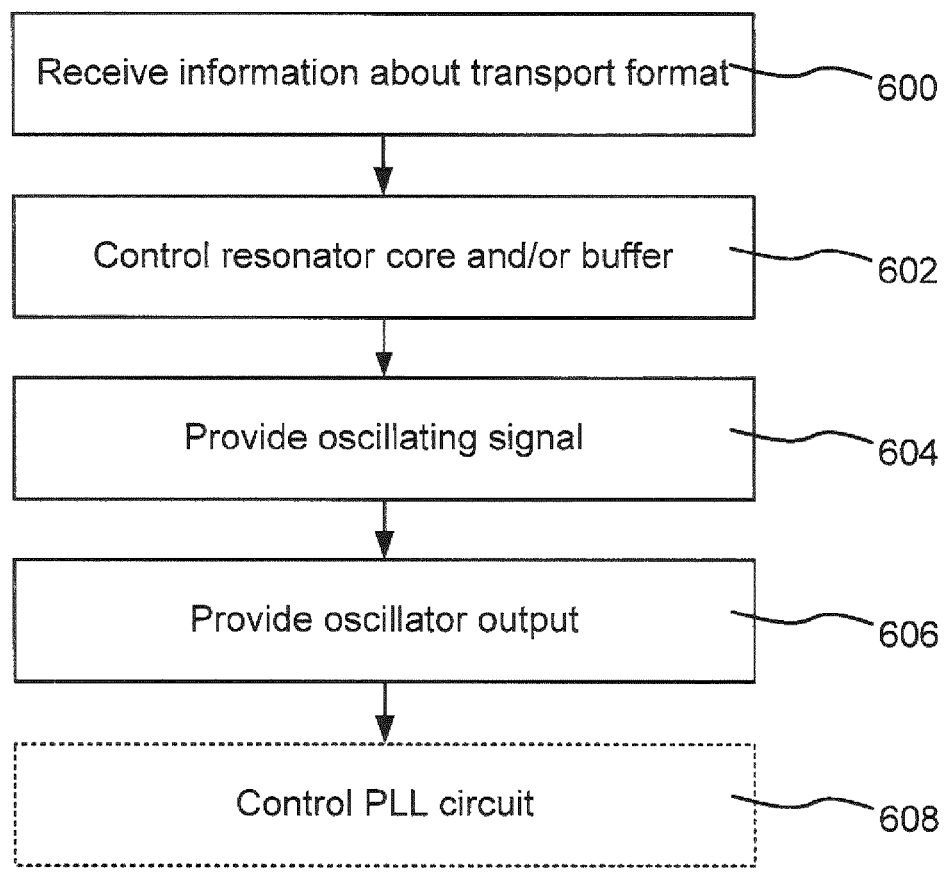
FIG. 6 is a flow chart illustrating a method according to an embodiment.

FIG. 6 is a flow chart illustrating a method according to an embodiment. Information about one or more applied transport formats is received 600, wherein the resonator core and/or the one or more reference oscillator buffers are controlled 602 accordingly, as has been discussed above. The resonator core is then enabled to provide 604 an oscillating signal to the reference oscillator buffer arrangement, wherein the reference oscillator buffer arrangement provides 606 the oscillator output. Optionally, as has been discussed with reference to FIG. 6 above, the PLL circuit may also be controlled 608.

Figure 7:
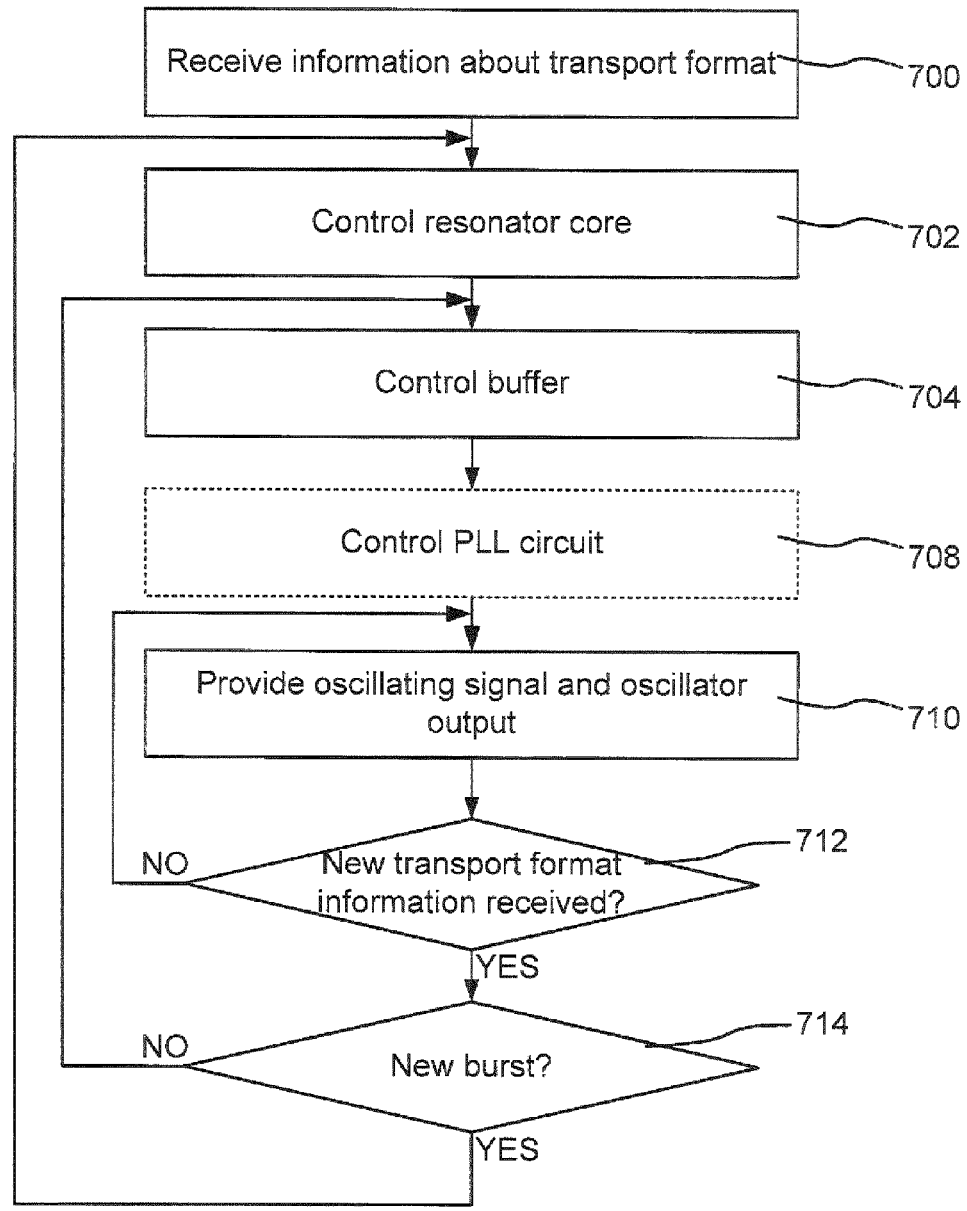
FIG. 7 is a flow chart illustrating a method according to an embodiment.

FIG. 7 is a flow chart illustrating a method according to an embodiment. The controlling of the resonator core may be sensitive to changes during operation, i.e. transmission and/or reception of a communication burst, and the adaption of control settings for the resonator core may therefore be set for the burst and then not changed until next burst. The controlling of the buffer arrangement on the other hand may be changed essentially instantaneously, wherein adaptions may be made during a burst.

The method comprises receiving 700 information about one or more applied transport formats, wherein the resonator core is controlled 702 and the control buffer arrangement is controlled 704 according to any of the approaches that have been discussed above. Optionally, the PLL circuit may also be controlled 706, as discussed above. The reference oscillator arrangement or oscillator arrangement may then provide 708 a signal. Reception of new transport format information is monitored 710. As long as no new information about transport formats is received, the reference oscillator arrangement or oscillator arrangement provides 708 a signal according to the current control settings. If new information about transport format is received, it is checked 712 if a new burst is to commence. If within an ongoing burst, the procedure returns to controlling the buffer arrangement 704 according to new control settings being based on the new transport format information, and possible controlling 706 of PLL circuit, and the monitoring 710 of new transport format information while providing 708 the signal accordingly. If a new burst is about to commence the procedure also includes controlling 702 the resonator core, as well as the controlling the buffer arrangement 704 according to new control settings being based on the new transport format information, and possible controlling 706 of PLL circuit, and the monitoring 710 of new transport format information while providing 708 the signal accordingly.

Upon use of a look-up table for the embodiment demonstrated with reference to FIG. 7, the table may include control settings where a certain control setting for the resonator core is presumed, wherein the control settings for the buffer arrangement, and possibly the PLL circuit, are mapped accordingly to new received information about transport format. Furthermore, the impact on phase and frequency stability may differ depending on controlling the resonator core and buffers, which may be considered when forming the control model and/or look-up table.

An alternative to changing the loop bandwidth is to change the phase noise performance also of the CO in accordance with the RO phase noise, with a maintained loop bandwidth, so that an increase in RO phase noise is also accompanied by an increase of CO phase noise and vice versa.

Figure 8:
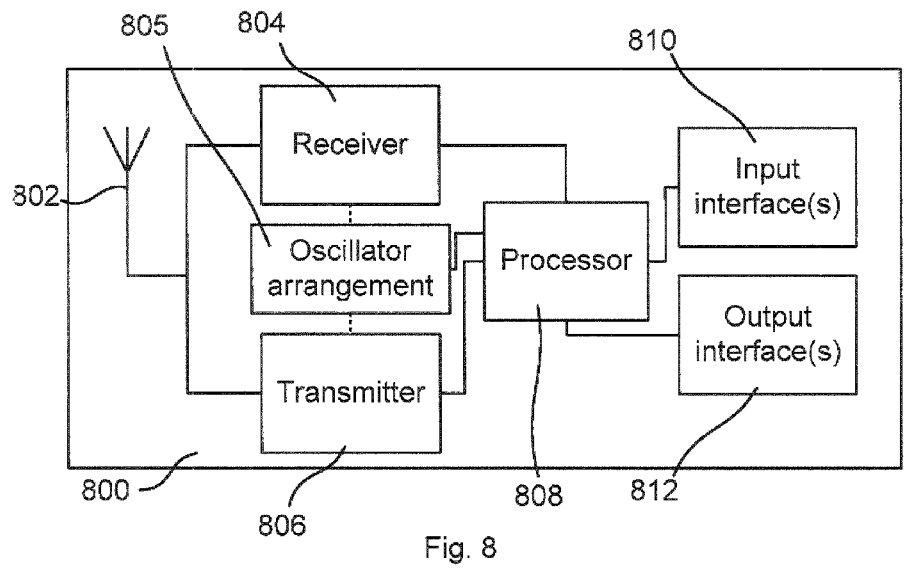
FIG. 8 is a block diagram schematically illustrating a communication device according to an embodiment.

FIG. 8 is a block diagram schematically illustrating a communication device 800 according to an embodiment. The communication device comprises an antenna arrangement 802, a receiver 804 connected to the antenna arrangement 802, a transmitter 806 connected to the antenna arrangement 802, a processing element 808 which may comprise one or more circuits, one or more input interfaces 810 and one or more output interfaces 812. The interfaces 810, 812 may be user interfaces and/or signal interfaces, e.g. electrical or optical. The communication device 800 is arranged to operate with a radio access network. For example, the communication device 800 may be arranged to operate in a cellular communication network, a wireless local area network, a wireless mesh network, etc. The communication device 800 is further arranged to communicate according to a plurality of transport formats. The processing element 808 may fulfill a multitude of tasks, ranging from signal processing to enable reception and transmission since it is connected to the receiver 804 and transmitter 806, executing applications, controlling the interfaces 810, 812, etc. The processing element 808 may for example provide information about transport format to be used for transmission and/or reception.

Figure 9:
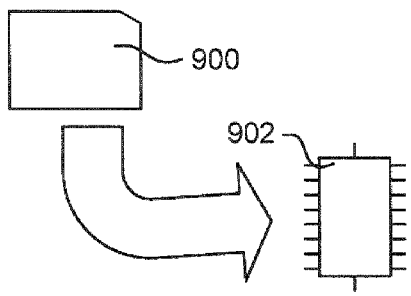
FIG. 9 schematically illustrates a computer-readable medium and a processing device.

The methods according to the present invention is suitable for implementation with aid of processing means, such as computers and/or processors, especially for the case where the controllers demonstrated above comprises a processor handling control settings of a reference oscillator and/or oscillator arrangement. Therefore, there is provided computer programs, comprising instructions arranged to cause the processing means, processor, or computer to perform the steps of any of the methods according to any of the embodiments described with reference to FIG. 5 or 6. The computer programs preferably comprises program code which is stored on a computer readable medium 900, as illustrated in FIG. 9, which can be loaded and executed by a processing means, processor, or computer 902 to cause it to perform the methods, respectively, according to embodiments, preferably as any of the embodiments described with reference to FIG. 5 or 6. The computer 902 and computer program product 900 can be arranged to execute the program code sequentially where actions of the any of the methods are performed stepwise. The processing means, processor, or computer 902 is preferably what normally is referred to as an embedded system. Thus, the depicted computer readable medium 900 and computer 902 in FIG. 9 should be construed to be for illustrative purposes only to provide understanding of the principle, and not to be construed as any direct illustration of the elements.

The invention claimed is:

1. A reference oscillator arrangement, for a communication apparatus capable of communicating according to a plurality of transport formats, the reference oscillator arrangement comprising:
   a reference oscillator controller;
   a resonator core comprising a reference resonator and a driving circuit for the reference resonator, wherein the resonator core is configured to provide an oscillating signal at a frequency of the reference resonator;

a reference oscillator buffer arrangement connected to the resonator core, the reference oscillator buffer arrangement comprising an active circuit configured to provide a reference oscillator output based on the oscillating signal; and wherein the reference oscillator controller is configured to:
receive information about an applied transport format, wherein the applied transport format is an applied format for transmission of information which both the transmitter at a transmitting side and a receiver at a receiving side use; and
control the driving circuit and/or the active circuit based on the information about the applied transport format.

2. The reference oscillator arrangement of claim 1, wherein the reference resonator is a crystal resonator or a microelectromechanical system (MEMS) resonator.

3. The reference oscillator arrangement of claim 1, wherein the reference oscillator controller is configured to perform the control by controlling bias of the driving circuit and/or the active circuit.

4. The reference oscillator arrangement of claim 1, wherein the reference oscillator buffer arrangement comprises a plurality of buffers for providing output signals to different circuits of the communication apparatus, each buffer comprising an active circuit, wherein the active circuits of at least a set of the buffers are individually controllable.

5. The reference oscillator arrangement of claim 1, wherein the reference oscillator controller comprises a lookup table configured to map transport formats to control settings of the driving circuit and/or the active circuit.

6. The reference oscillator arrangement of claim 1, wherein the reference oscillator controller is configured to control by adjusting the driving circuit once for a transmission burst of the communication apparatus.

7. The reference oscillator arrangement of claim 1, wherein the reference oscillator controller is configured to control by adjusting the active circuit at a plurality of instances during a transmission burst of the communication apparatus.

8. The reference oscillator arrangement of claim 1, wherein the applied transport format is related to communications over a wireless channel.

9. An oscillator arrangement, for a communication apparatus capable of communicating according to a plurality of transport formats, the oscillator arrangement comprising:
a reference oscillator arrangement, the reference oscillator arrangement comprising:
a reference oscillator controller;
a resonator core comprising a reference resonator and a driving circuit for the reference resonator, wherein the resonator core is configured to provide an oscillating signal at a frequency of the reference resonator;
a reference oscillator buffer arrangement connected to the resonator core, the reference oscillator buffer arrangement comprising an active circuit configured to provide a reference oscillator output based on the oscillating signal;
wherein the reference oscillator controller is configured to:
receive information about an applied transport format, wherein the applied transport format is an applied format for transmission of information which both the transmitter at a transmitting side and a receiver at a receiving side use; and
control the driving circuit and/or the active circuit based on the information about the applied transport format; and
wherein the reference oscillator arrangement is capable of adjusting phase noise of the generated reference oscillator output; and
a phase-locked loop circuit comprising a phase detector configured to receive an output signal from the reference oscillator arrangement.

10. The oscillator arrangement of claim 9, wherein the phase-locked loop circuit is configured to adjust a loop bandwidth of a phase-locked loop thereof such that:
an increase in phase noise of the generated reference oscillator output implies a decrease in loop bandwidth; and
a decrease in phase noise of the generated reference oscillator output implies an increase in loop bandwidth.

11. The oscillator arrangement of claim 9:
wherein the phase-locked loop circuit further comprises a controlled oscillator which is configured to:
provide an oscillator signal based on a filtered output from the phase detector; and
receive different settings from the reference oscillator controller for providing different levels of phase noise such that:
an increase in phase noise of the generated reference oscillator output implies an increase in phase noise of the controlled oscillator; and
a decrease in phase noise of the generated reference oscillator output causes a decrease in phase noise of the controlled oscillator.

12. The oscillator arrangement of claim 9, wherein the reference oscillator arrangement is configured to be controlled such that:
a decrease in a loop bandwidth of a phase-locked loop of the phase-locked loop circuit implies an increase in phase noise of the generated reference oscillator output; and
an increase in the loop bandwidth implies a decrease in phase noise of the generated reference oscillator output.

13. A method of controlling an oscillator arrangement for a communication apparatus capable of communicating according to a plurality of transport formats, wherein the method comprises:
providing an oscillating signal at a frequency of a reference resonator of a resonator core, the resonator core comprising the reference resonator and a driving circuit for the reference resonator;
providing, by a reference oscillator buffer arrangement connected to the resonator core, a reference oscillator output based on the oscillating signal; the reference oscillator buffer arrangement comprising an active circuit configured to provide reference oscillator output based on the oscillating signal;
receiving information about an applied transport format, wherein the applied transport format is an applied format for transmission of information which both the transmitter at a transmitting side and a receiver at a receiving side use; and
controlling the driving circuit and/or the active circuit based on the information about the applied transport format.

14. The method of claim 13, wherein the controlling comprises controlling bias of the driving circuit and/or the active circuit.

15. The method of claim 13:
wherein the reference oscillator buffer arrangement comprises a plurality of buffers for providing output signals to different circuits of the communication apparatus, each buffer comprising an active circuit; and
wherein the method comprises controlling active circuits of at least a set of the buffers individually.

16. The method of claim 13, further comprising controlling settings of the driving circuit and/or the active circuit by mapping transport formats to control settings from a look-up table.

17. The method of claim 13, further comprising controlling the driving circuit to adjust once for a transmission burst of the communication apparatus.

18. The method of claim 13, further comprising controlling the active circuit to adjust at a plurality of instances during a transmission burst of the communication apparatus.

19. The method of claim 13:
wherein the oscillator arrangement further comprises a phase-locked loop circuit comprising a phase detector configured to receive an output signal from a reference oscillator arrangement; and
wherein the method further comprises adjusting a loop bandwidth of a phase-locked loop of the phase-locked loop circuit such that:
an increase in phase noise of the generated reference oscillator output implies a decrease in loop bandwidth; and
a decrease in phase noise of the generated reference oscillator output implies an increase in loop bandwidth.

20. The method of claims 13:
wherein the oscillator arrangement comprises a phase-locked loop circuit comprising a phase detector configured to receive an output signal from a reference oscillator arrangement;
wherein the phase-locked loop circuit comprises a controlled oscillator which is configured to provide an oscillator signal based on a filtered output from the phase detector;
wherein the controlled oscillator is configured to receive different settings from the reference oscillator controller for providing different levels of phase noise; and
wherein the method further comprises controlling the controlled oscillator such that:
an increase in phase noise of the generated reference oscillator output implies an increase in phase noise of the controlled oscillator; and
a decrease in phase noise of the generated reference oscillator output implies a decrease in phase noise of the controlled oscillator.

21. The method of claim 13:
wherein the oscillator arrangement comprises a phase-locked loop circuit and a reference oscillator arrangement;
wherein the reference oscillator arrangement comprises the reference resonator core and the reference buffer arrangement; and
wherein the method comprises controlling the reference oscillator arrangement such that:
an increase in a loop bandwidth of the phase-locked loop circuit implies a decrease in phase noise of the generated reference oscillator output; and
a decrease in the loop bandwidth implies an increase in phase noise of the generated reference oscillator output.

22. A communication device for operating with a radio access network and capable of communicating according to a plurality of transport formats, the communication device comprising:
a transceiver configured to transmit or receive one or more data messages over a wireless channel; and
a reference oscillator arrangement, the reference oscillator arrangement comprising:
a reference oscillator controller;
a resonator core comprising a reference resonator and a driving circuit for the reference resonator, wherein the resonator core is configured to provide an oscillating signal at a frequency of the reference resonator;
a reference oscillator buffer arrangement connected to the resonator core, the reference oscillator buffer arrangement comprising an active circuit configured to provide a reference oscillator output based on the oscillating signal; and
wherein the reference oscillator controller is configured to:
receive information about an applied transport format, wherein the applied transport format is an applied format for transmission of information which both the transmitter at a transmitting side and a receiver at a receiving side use; and
control the driving circuit and/or the active circuit based on the information about the applied transport format.

* * * * *